(12) United States Patent
Lu

(10) Patent No.: US 12,055,912 B2
(45) Date of Patent: Aug. 6, 2024

(54) WAFER REPAIR METHOD, APPARATUS AND DEVICE, AND STORAGE MEDIUM

(71) Applicant: CHANGXIN MEMORY TECHNOLOGIES, INC., Hefei (CN)

(72) Inventor: Yubin Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 436 days.

(21) Appl. No.: 17/439,030

(22) PCT Filed: Jun. 11, 2021

(86) PCT No.: PCT/CN2021/099841
§ 371 (c)(1),
(2) Date: Sep. 14, 2021

(87) PCT Pub. No.: WO2022/037207
PCT Pub. Date: Feb. 24, 2022

(65) Prior Publication Data
US 2023/0061095 A1 Mar. 2, 2023

(30) Foreign Application Priority Data
Aug. 19, 2020 (CN) .......................... 202010839653.4

(51) Int. Cl.
*G05B 19/18* (2006.01)
*G06F 16/11* (2019.01)

(52) U.S. Cl.
CPC .......... *G05B 19/188* (2013.01); *G06F 16/116* (2019.01); *G05B 2219/32228* (2013.01); *G05B 2219/45165* (2013.01)

(58) Field of Classification Search
CPC ........ G05B 19/188; G05B 2219/32228; G05B 2219/45165; G06F 16/116
(Continued)

(56) References Cited

U.S. PATENT DOCUMENTS 6,580,959 B1 * 6/2003 Mazumder ......... G05B 19/4185
700/121
2004/0186609 A1 * 9/2004 Patel ................... G03F 7/70991
700/121

(Continued)

FOREIGN PATENT DOCUMENTS

CN 101581754 A 11/2009
CN 103199041 A 7/2013
(Continued)

OTHER PUBLICATIONS

International Search Report cited in PCT/CN2021/099841 mailed Sep. 15, 2021, 10 pages.

*Primary Examiner* — Md Azad
(74) *Attorney, Agent, or Firm* — Kilpatrick Townsend & Stockton LLP

(57) ABSTRACT

The present disclosure provides a wafer repair method, system, apparatus and device, and a storage medium, relating to the field of semiconductor devices. The method includes: a laser equipment acquires test data for repairing a predetermined wafer; the laser equipment sending the test data to a processing server so that the processing server converts the test data into repair data in a predetermined format; and the laser equipment obtaining the repair data in the predetermined format to repair the predetermined wafer.

17 Claims, 6 Drawing Sheets

(58) Field of Classification Search
USPC .......................................................... 700/166
See application file for complete search history.

(56) References Cited

U.S. PATENT DOCUMENTS

| | | | |
|---|---|---|---|
| 2005/0246049 A1* | 11/2005 | Suttile | G06Q 10/06 |
| | | | 700/121 |
| 2007/0142950 A1* | 6/2007 | Okita | G03F 7/70525 |
| | | | 700/121 |
| 2008/0314878 A1* | 12/2008 | Cai | B22F 10/80 |
| | | | 700/67 |
| 2009/0297019 A1* | 12/2009 | Zafar | G06F 30/398 |
| | | | 382/145 |
| 2014/0351792 A1 | 11/2014 | Li | |

FOREIGN PATENT DOCUMENTS

| | | |
|---|---|---|
| CN | 104077271 A | 10/2014 |
| CN | 102833137 B | 11/2015 |
| CN | 107291481 A | 10/2017 |
| CN | 107493560 A | 12/2017 |

* cited by examiner

30

| A laser equipment acquires test data for repairing a predetermined wafer | S302 |

| The laser equipment sends the test data to a processing server so that the processing server converts the test data into repair data in a predetermined format | S304 |

| The laser equipment obtains the repair data in the predetermined format to repair the predetermined wafer | S306 |

WAFER REPAIR METHOD, APPARATUS AND DEVICE, AND STORAGE MEDIUM

CROSS-REFERENCE TO RELATED APPLICATIONS

The present disclosure is a national stage entry of International Application No. PCT/CN2021/099841, filed on Jun. 11, 2021, which claims the priority to Chinese Patent Application 202010839653.4, titled "WAFER REPAIR METHOD, APPARATUS AND DEVICE, AND STORAGE MEDIUM", filed on Aug. 19, 2020. The entire contents of International Application No. PCT/CN2021/099841 and Chinese Patent Application 202010839653.4 are incorporated herein by reference in their entireties.

TECHNICAL FIELD

The present disclosure relates to the field of semiconductor devices, and in particular, to a wafer repair method, system, apparatus and device, and a readable storage medium.

BACKGROUND

As integrated circuits continue to develop toward smaller external dimensions, more devices will be integrated on chips. A chip manufacturing process mainly comprises steps of chip design, wafer manufacturing, packaging, wafer testing, etc. During the manufacturing of some dynamic random access memory (DRAM) or static random access memory (SRAM) products, a repair step is configured after wafer testing, so that when a normal circuit in a chip cannot be activated, a backup circuit is activated to enable the chip to work normally. The existing wafer repair process generally adopts laser repair or fuse circuit repair. Laser repair is to repair a wafer with laser through a laser equipment according to wafer test data. However, the storage space of the existing laser equipment is limited, and laser repair errors are prone to occur, thereby reducing repair efficiency and effect.

As mentioned above, how to improve the repair efficiency and effect of the laser equipment has become an urgent problem to be solved.

The above-mentioned information disclosed in the background is only used to enhance the understanding of the background of the present disclosure, and therefore it can comprise information that does not constitute the prior art known to those of ordinary skill in the art.

SUMMARY

Characteristics and advantages of the present disclosure will become apparent through the following detailed description, or are partly learned through the practice of the present disclosure.

According to one aspect of the present disclosure, a wafer repair method is provided, comprising: a laser equipment acquiring test data for repairing a predetermined wafer; the laser equipment sending the test data to a processing server so that the processing server converts the test data into repair data in a predetermined format; and the laser equipment obtaining the repair data in the predetermined format to repair the predetermined wafer.

According to another aspect of the present disclosure, a wafer repair method is provided, comprising: a processing server acquiring test data sent by a laser equipment for repairing a predetermined wafer; the processing server converting the test data into repair data in a predetermined format; and the processing server sending the repair data in the predetermined format to the laser equipment so that the laser equipment repairs the predetermined wafer.

According to another aspect of the present disclosure, a wafer repair system is provided, comprising a laser equipment and a processing server, the laser equipment being connected to the processing server, wherein: the laser equipment is configured to obtain test data for repairing a predetermined wafer, send the test data to the processing server, obtain repair data in a predetermined format, and repair the predetermined wafer; and the processing server is configured to acquire the test data, and convert the test data into the repair data in the predetermined format.

According to another aspect of the present disclosure, a device is provided, comprising: a memory, a processor, and executable instructions stored in the memory and executable in the processor, wherein when the processor executes the executable instructions, any of the above methods is implemented.

According to another aspect of the present disclosure, a computer-readable storage medium is provided, storing computer executable instructions thereon, wherein when the executable instructions are executed by a processor, any of the above methods is implemented.

It should be understood that the above general description and the following detailed description are only exemplary and cannot limit the present disclosure.

BRIEF DESCRIPTION OF THE DRAWINGS

By describing exemplary embodiments in detail with reference to the accompanying drawings, the above and other objectives, features, and advantages of the present disclosure will become more apparent.

DETAILED DESCRIPTION

Figure 1:
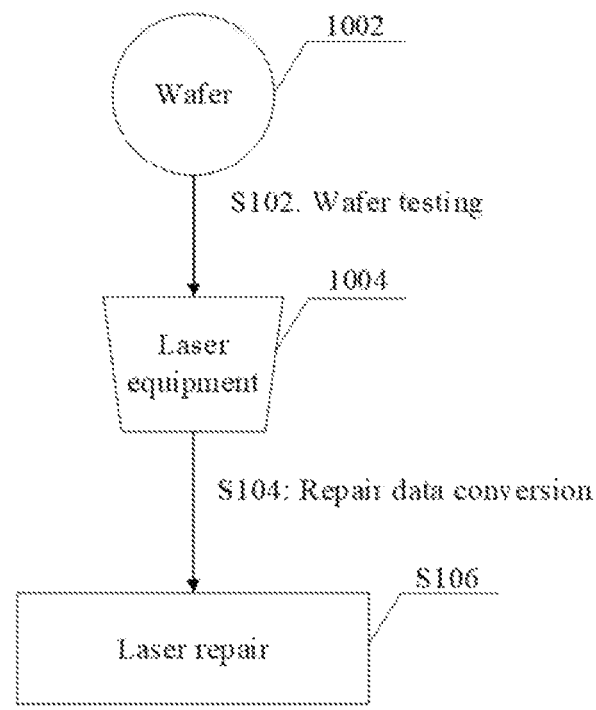
FIG. 1 shows a schematic diagram of a repair process after wafer testing in a related technology.

Example embodiments are now described more comprehensively with reference to the accompanying drawings. However, the example embodiments can be implemented in various forms, and should not be construed as being limited to the examples set forth herein; on the contrary, the provision of these embodiments makes the present disclosure more comprehensive and complete, and fully conveys the concept of the example embodiments to those skilled in the art. The drawings are only schematic illustrations of the present disclosure, and are not necessarily drawn to scale.

The same reference numerals in the drawings denote the same or similar parts, and repeated descriptions thereof are thereby omitted.

In addition, the described features, structures or characteristics can be combined in one or more embodiments in any suitable way. In the following description, many specific details are provided to provide a sufficient understanding of the embodiments of the present disclosure. However, those skilled in the art would realize that the technical solutions of the present disclosure can be practiced without one or more of the specific details, or other methods, apparatuses, steps, etc. can be adopted. In other cases, well-known structures, methods, apparatuses, implementations or operations are not shown or described in detail in order to avoid distracting and obscuring all aspects of the present disclosure.

In addition, the terms "first", "second", etc. are only for the sake of description, and cannot be understood as indicating or implying the relative importance or implicitly indicating the quantity of technical features indicated. Thus, the features defined by "first" and "second" can explicitly or implicitly comprise one or more of these features. In the description of the present disclosure, "a plurality of" means at least two, e.g., two, three, etc., unless otherwise specified. The symbol "/" generally indicates that the successively associated objects are in an "or" relationship.

In the present disclosure, unless otherwise specified and defined, the terms "connected" should be generally understood, for example, electrically connected, mutually communicated, directly connected, or indirectly connected by a medium. For those of ordinary skill in the art, the specific meaning of the above-mentioned terms in the present disclosure can be understood according to specific circumstances.

A repair process after wafer testing in a related technology is shown in FIG. 1. A wafer 1002 undergoes wafer testing (S102) to generate wafer test data, a laser equipment 1004 obtains the wafer test data, and the laser equipment 1004 converts the wafer test data into repair data in a format that can be identified by the laser equipment 1004 (S104), and then repairs the wafer with laser (S106).

As mentioned above, the laser equipment in the related technology has limited storage space and cannot be expanded due to its characteristics. It takes a relatively long time for format conversion after the wafer test data is obtained, resulting in low utilization of the laser equipment. In addition, when the test data is relatively large, the equipment is prone to crash, resulting in errors in the laser repair of the wafer and wafer loss.

Therefore, the present disclosure provides a wafer repair method. A laser equipment acquires test data for repairing a predetermined wafer and then sends the test data to a processing server so that the processing server converts the test data into repair data in a predetermined format, and the laser equipment obtains the repair data in the predetermined format to repair the predetermined wafer, which can effectively improve the efficiency and effect of repairing the wafer by the laser equipment.

Figure 2A:
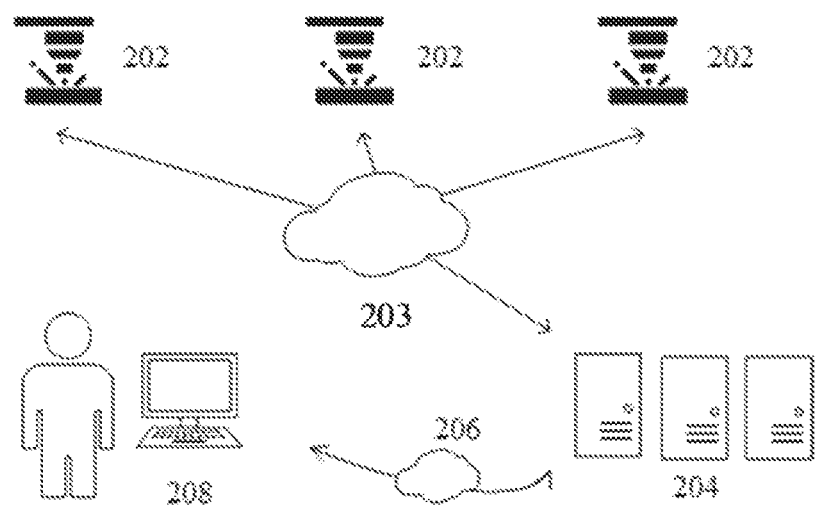
FIG. 2A shows a schematic structure diagram of a wafer repair system in an embodiment of the present disclosure.

FIG. 2A shows a wafer repair system according to an exemplary embodiment. The wafer repair system comprises a laser equipment 202 and a processing server 204, and the laser equipment 202 is connected to the processing server 204 via a network 206.

The laser equipment 202 acquires test data for repairing a predetermined wafer, and then sends the test data to the processing server 204. After the processing server 204 converts the test data into repair data in a predetermined format, the laser equipment 202 obtains the repair data in the predetermined format from the processing server 204. Then the laser equipment 202 repairs the predetermined wafer according to the repair data. The model of the laser equipment is not limited.

The number of laser equipment 202 can be plural, and the plurality of laser equipment 202 can be respectively connected to the processing server 204 via the local area network 203. For example, the processing server 204 can be configured in a clean wafer manufacturing room, and the processing server 204 can be opened for local area connection with the plurality of laser equipment 202 to communicate with the network 206. The remote processing server 204 can be configured as, for example, a 16 G memory, a 100 G hard disk, and a 4-core central processing unit (CPU).

The wafer repair system can further comprise, for example, a terminal device 208 connected to the processing server 204 via the network 206, for configuring and deploying the processing server 204.

According to the wafer repair system provided by the embodiment of the present disclosure, after the laser equipment obtains the wafer test data, format conversion is performed by the processing server, so that the memory of the laser equipment does not need to be used for processing data conversion, so as to improve the utilization of the equipment.

Figures 2B, 3A:
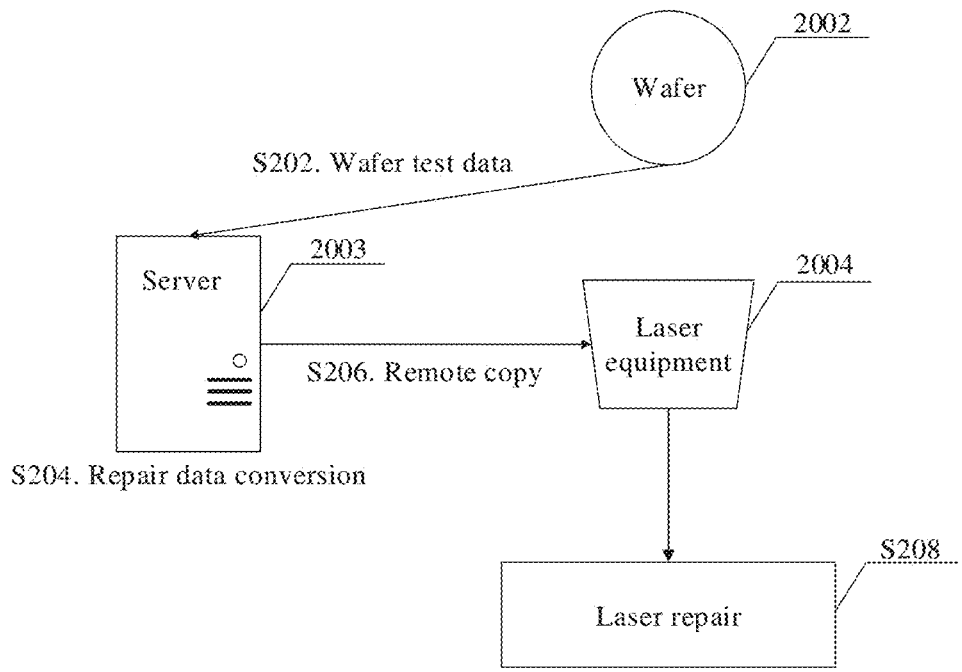
FIG. 2B shows a schematic diagram of a wafer repair process according to an exemplary embodiment.
FIG. 3A shows a flowchart of a wafer repair method in an embodiment of the present disclosure.

FIG. 2B shows a schematic diagram of a wafer repair process according to an exemplary embodiment. As shown in FIG. 2B, after a wafer 2002 undergoes wafer testing (S202), a server 2003 obtains wafer test data and then converts the same into repair data in a format that can be identified by a laser equipment 2004 (S204), and remotely copies the repair data to the laser equipment 2004 (S206), and then the laser equipment 2004 performs laser repair on the wafer (S208). The server 2003 can be a file server.

FIG. 3A is a flowchart showing a wafer repair method according to an exemplary embodiment. The method shown in FIG. 3A can be applied to, for example, the laser equipment 202 of the above system.

Referring to FIG. 3A, the method 30 provided by the embodiment of the present disclosure can comprise the following steps.

In step S302, a laser equipment acquires test data for repairing a predetermined wafer. Wafer testing is to probe each die on the wafer to test its electrical characteristics. The unqualified die will be marked, and its location on the wafer will be recorded and saved in the test data.

Figure 3B:
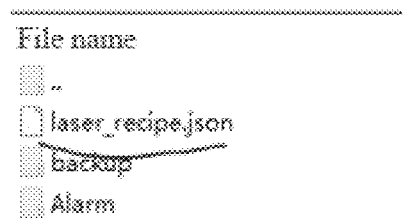
FIG. 3B shows an example diagram of a test data file in an embodiment of the present disclosure.

In some embodiments, for example, the test data can comprise a test program version, a wafer lot number, etc. According to this information, the test data of the corresponding wafer can be found in the corresponding storage location. The test data is generated by a test system and can be stored in a File Transfer Protocol (FTP) server, as shown in FIG. 3B, for example, stored in the FTP in the format of JavaScript Object Notation (JSON) for a file conversion program to capture.

In step S304, the laser equipment sends the test data to a processing server so that the processing server converts the test data into repair data in a predetermined format. The laser equipment can call the processing server through a file conversion instruction to acquire the test data from the FTP through a file conversion program, and then the processing server continues to execute the file conversion program to convert the test data into the repair data in the predetermined format.

In some embodiments, for example, the data generated during the wafer testing can be an asc format file, comprising wafer information, location information that needs to be repaired, etc.; and the data that can be identified by the laser equipment after the conversion can be a rep format file, wherein the location information that needs to be repaired is converted into decimal laser fuse coordinates, such as "x=2, y=11", so that the laser equipment performs laser repair.

In some embodiments, for example, during the conversion, the file conversion program can feed the file conversion process back on an interface in real time, the conversion is completed after 100%, and the specific time of the file conversion, the total time taken to complete the conversion, etc. can be recorded.

In step S306, the laser equipment obtains the repair data in the predetermined format to repair the predetermined wafer. The laser equipment can perform laser repair based on the laser fuse coordinates to repair the predetermined wafer. The laser equipment does not need to perform the file conversion, and its memory is only used for repair, which can improve the laser repair efficiency of the equipment.

According to the wafer repair method provided by the embodiment of the present disclosure, a laser equipment acquires test data for repairing a predetermined wafer and then sends the test data to a processing server so that the processing server converts the test data into repair data in a predetermined format, and the laser equipment obtains the repair data in the predetermined format to repair the predetermined wafer, so that the laser equipment does not need to perform data conversion, which improves the utilization of the equipment and effectively improve the efficiency and effect of repairing the wafer by the laser equipment.

Figure 4:
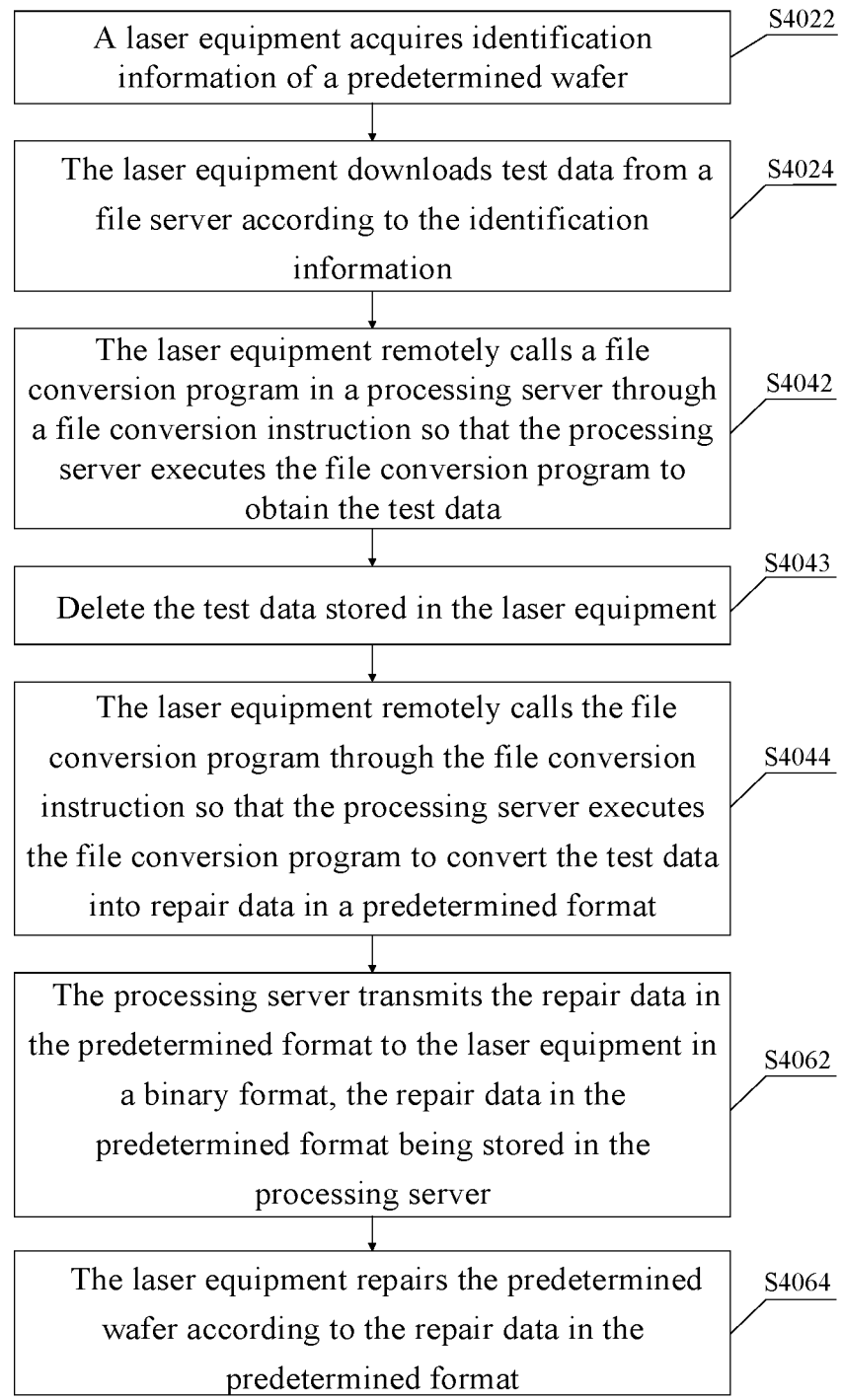
FIG. 4 shows a flowchart of another wafer repair method in an embodiment of the present disclosure.

FIG. 4 is a flowchart showing another wafer repair method according to an exemplary embodiment. The method shown in FIG. 4 can be applied to, for example, the laser equipment 202 of the above system.

Referring to FIG. 4, the method 40 provided by the embodiment of the present disclosure can comprise the following steps.

In step S4022, a laser equipment acquires identification information of a predetermined wafer. A predetermined lot of wafers can be reserved to the laser equipment, and the laser equipment can download corresponding test data from an FTP server through identification information of the reserved wafer.

In step S4024, the laser equipment downloads test data from a file server according to the identification information. The laser equipment can download the test data locally for subsequent format conversion.

In some embodiments, the process of downloading the test data by the laser equipment comprises initializing an input and output folder and deleting recorded original test files before downloading, then connecting to an FTP server by determining an IP address, and reading and downloading the test data. Specifically, the test data can be downloaded based on wafer information such as lot information according to a corresponding program to complete the step of downloading the test data by the laser equipment. In addition, a lot can comprise a plurality of wafers. Therefore, the test data of the plurality of wafers can be downloaded in a process of calling the program.

In step S4042, the laser equipment remotely calls a file conversion program in a processing server through a file conversion instruction so that the processing server executes the file conversion program to obtain the test data. The system environment of the laser equipment is different from the system environment of the processing server. The file conversion instruction can remotely call the file conversion program to transmit the test data to the remote processing server, and to perform file conversion remotely. A method of transmitting the test data to the remote processing server comprises copying the test data to the processing server, and the local laser equipment stores the test data. In addition, the method further comprises transmitting the test data to the processing server, and the local laser equipment no longer stores the test data. The latter can effectively reduce the used space of the laser equipment and effectively improve the storage space utilization of the equipment.

In some embodiments, for example, an operating system of the laser equipment is White Box (currently there is no such system product on the market, which makes it impossible to simply expand the memory capacity of the equipment), and the file conversion instruction "runlr" can be executed on the operating system; the remote processing server can be a Linux system; therefore, the file conversion instruction needs to be compatible with the double systems, and Java 5.0 software is used to program in different environments to call the remote file conversion program of the Linux system on the processing server at the White Box. The remote processing server deploys the file conversion program "rconv". The language of the remote file conversion program is not limited and can be developed according to the operating system of the remote processing server.

In step S4043, the test data stored in the laser equipment is deleted. After the processing server obtains the test data through the file conversion program, the laser equipment can delete the test data stored therein in order to expand the storage space of the laser equipment and improve the utilization of the equipment.

In step S4044, the laser equipment remotely calls the file conversion program through the file conversion instruction so that the processing server executes the file conversion program to convert the test data into repair data in a predetermined format.

In some embodiments, for example, the transmission speed of the memory of the processing server is higher than the transmission speed of the memory of the laser equipment. The memory model of the operating system of the laser equipment is DDR2, and the memory cannot be expanded locally. The memory model of the processing server can be DDR4. The file conversion instruction remotely calls the file conversion program of the processing server at the operating system of the laser equipment to realize interaction between different memory models, and the memories can be connected through an Ethernet interface, a provided fixed IP port and a gateway. The memory DDR4 of the processing server can have a size of 16 G or more, such as 32 G or 64 G. The file conversion program is developed and the file conversion is performed in this server. The file conversion program can be automatically executed after being called, and the total conversion time of the test data of a lot of 25 wafer products can be 85 s.

In some embodiments, for example, the transmission speed of the memory of the processing server is the same as the transmission speed of the memory of the laser equipment. The format conversion of the test data is performed by calling the server remotely, not performed at the laser equipment locally to improve the utilization of the equipment.

In some embodiments, for example, a process of conversion failure can be recorded accordingly, and the corresponding wafer can be detained through a production system. The wafer detention record is fed back to the user, so that the user can restart the production operation, which avoids error operations during the production. If the laser equipment gives an alarm due to conversion failure and other reasons in the midway of the operation, the operation needs to be restarted. Then whether the files of the previous operation remain on the local directory of the laser equipment will be checked when the data is re-converted, and the file conversion program will clear the remaining data and then perform a second file conversion, for example, initialize a lot data folder, a wafer data folder, a repair data folder, etc. in turn, clear the files of the previous operation, and then perform a second file conversion. In step S4062, the processing server transmits the repair data in the predetermined format to the laser equipment in a binary format, the repair data in the predetermined format being stored in the processing server. After the file conversion, the processing server can transmit the repair data to the local laser equipment. The data is automatically copied and transmitted, which does not take additional time and does not occupy the central processing unit of the laser equipment.

In some embodiments, for example, the converted file is copied from the Linux environment of the processing server to the laser equipment through the file conversion program, and the copied data is transmitted in a binary format, which can avoid data loss caused by copying data in different system environments, ensure that the data is correctly transmitted to the laser equipment, and avoid laser operation errors.

In some embodiments, for example, the repair data file after the format conversion can record file identification information, conversion completion time, etc., and the converted file can be in a rep format.

In some embodiments, for example, the remote processing server can establish a backup system to store the converted data in a backup folder for subsequent historical data query. For example, the backup folder can comprise a plurality of sub-folders, which can further comprise a plurality of sub-folders that are the converted repair data of a plurality of wafers. A hard disk of the remote processing server can retain data for a long time, which facilitates follow-up analysis.

In step S4064, the laser equipment repairs the predetermined wafer according to the repair data in the predetermined format. The test data is converted by the remote processing server, without occupying the processing resources of the local laser equipment.

In some embodiments, for example, the test data of each wafer of DDR4 products has a size of about 60 M, and the laser equipment has a memory of 1 G. In a related technology, file conversion is performed in the laser equipment locally. If the conversion time for the test data of each wafer is about 5 min, and the conversion time for each lot of wafers (such as 25 pieces) is about 25*5=125 min, then 125 min of file conversion time is required before the laser repair operation. According to the method provided by the embodiment of the present disclosure, the laser equipment calls the file conversion program to perform file conversion through the processing server. If the conversion time for each wafer is about 3 s, the conversion time for each lot of 25 wafers is 25×3=75 s, and the time for remotely copying data from the processing server to the local laser equipment is about 20 s, the total time is not more than 2 minutes. Then about 112 min of operation waiting time is reduced for each lot. Therefore, the utilization of the equipment is improved, the problems of reduction in processing capability of the equipment, crash and increase in data errors due to the occupation of the memory space of the laser equipment by the conversion of the test data are avoided, losses such as wafer scrap caused by laser repair errors are reduced, wafer yield is improved, and wafer manufacturing costs are lowered.

In some embodiments, for example, the laser repair process can be recorded in a file, which can comprise wafer identification information, wafer model, lot information, processing time, etc., and whether any abnormality occurs during the laser repair of the wafer can also be recorded.

Figure 5:
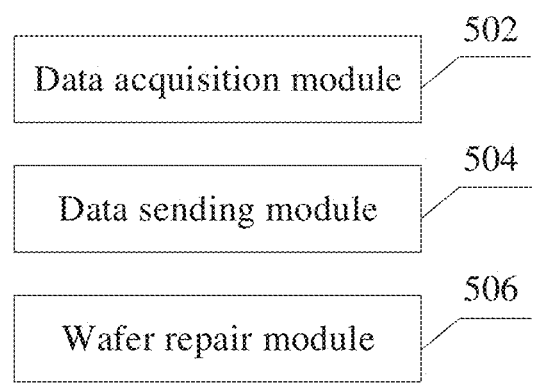
FIG. 5 shows a block diagram of a wafer repair apparatus in an embodiment of the present disclosure.

FIG. 5 is a block diagram showing a wafer repair apparatus according to an exemplary embodiment. The apparatus shown in FIG. 5 can be applied to, for example, the above laser equipment 202.

Referring to FIG. 5, the apparatus 50 provided by the embodiment of the present disclosure can comprise a data acquisition module 502, a data sending module 504, and a wafer repair module 506.

The data acquisition module 502 can be configured for a laser equipment to acquire test data for repairing a predetermined wafer.

The data sending module 504 can be configured for the laser equipment to send the test data to a processing server so that the processing server converts the test data into repair data in a predetermined format.

The wafer repair module 506 can be configured for the laser equipment to obtain the repair data in the predetermined format to repair the predetermined wafer.

Figure 6:
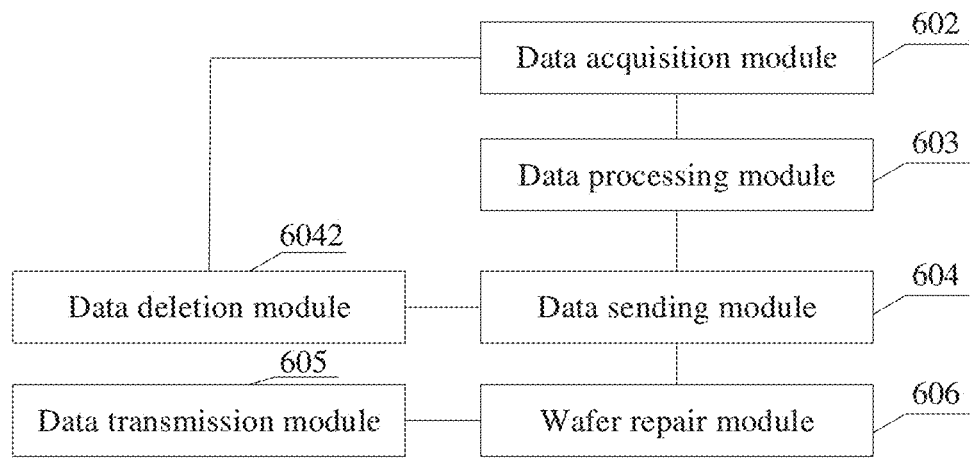
FIG. 6 shows a block diagram of another wafer repair apparatus in an embodiment of the present disclosure.

FIG. 6 is a block diagram showing another wafer repair apparatus according to an exemplary embodiment. The apparatus shown in FIG. 6 can be applied to, for example, the above laser equipment 202.

Referring to FIG. 6, the apparatus 60 provided by the embodiment of the present disclosure can comprise a data acquisition module 602, a data processing module 603, a data sending module 604, a data deletion module 6042, a data transmission module 605, and a wafer repair module 606.

The data acquisition module 602 can be configured for a laser equipment to acquire identification information of a predetermined wafer.

The data acquisition module 602 can be further configured for the laser equipment to download test data from a file server according to the identification information.

The data processing module 603 can be configured for the laser equipment to remotely call a file conversion program in a processing server through a file conversion instruction so that the processing server executes the file conversion program to obtain the test data. The transmission speed of a memory of the processing server is higher than the transmission speed of a memory of the laser equipment. The system environment of the laser equipment is different from the system environment of the processing server.

The data processing module 603 can be further configured for the laser equipment to remotely call the file conversion program through the file conversion instruction so that the processing server executes the file conversion program to convert the test data into repair data in a predetermined format.

The data sending module 604 can be configured for the laser equipment to send the test data to the processing server so that the processing server converts the test data into the repair data in the predetermined format.

The data deletion module 6042 can be configured to delete the test data stored in the laser equipment.

The data transmission module 605 can be configured to transmit the repair data in the predetermined format to the laser equipment in a binary format, the repair data in the predetermined format being stored in the processing server.

The wafer repair module 606 can be configured for the laser equipment to obtain the repair data in the predetermined format to repair the predetermined wafer.

The wafer repair module 606 can be further configured for the laser equipment to repair the predetermined wafer according to the repair data in the predetermined format.

The specific implementation of each module in the apparatus provided by the embodiment of the present disclosure can refer to the content in the above-mentioned method, and details are not described herein again.

Figure 7:
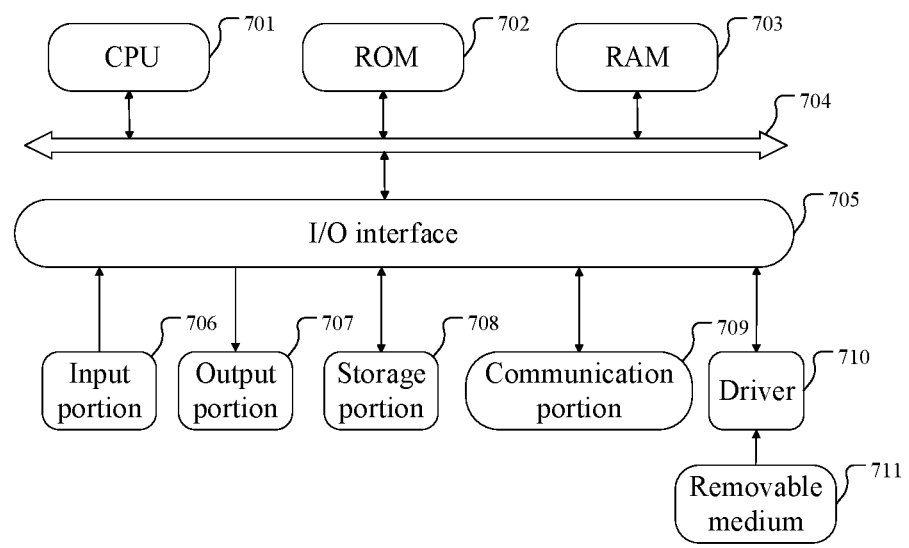
FIG. 7 shows a schematic structure diagram of an electronic device in an embodiment of the present disclosure.

FIG. 7 shows a schematic structure diagram of an electronic device in an embodiment of the present disclosure. It should be noted that the device shown in FIG. 7 only takes a computer system as an example, and should not bring any limitation to the function and scope of the embodiments of the present disclosure.

As shown in FIG. 7, the device 700 comprises a central processing unit (CPU) 701, which can execute various appropriate operations and processes according to a program stored in a read-only memory (ROM) 702 or a program loaded from a storage portion 708 to a random access memory (RAM) 703. In the RAM 703, various programs and data required for the operations of the device 700 are also stored. The CPU 701, the ROM 702, and the RAM 703 are connected to each other by a bus 704. An input/output (I/O) interface 705 is also connected to the bus 704.

The following components are connected to the I/O interface 705: an input portion 706 comprising a keyboard, a mouse, etc.; an output portion 707 comprising a cathode ray tube (CRT), a liquid crystal display (LCD), a speaker, etc.; a storage portion 708 comprising a hard disk, etc.; and a communication portion 709 comprising a network interface card, such as an LAN card and a modem. The communication portion 709 performs communication processing via a network such as the Internet. A driver 710 is also connected to the I/O interface 705 as needed. A removable medium 711 such as a magnetic disk, an optical disk, a magneto-optical disk or a semiconductor memory is installed on the driver 710 as needed, so that a computer program read therefrom is installed in the storage portion 708 as needed.

Particularly, according to the embodiments of the present disclosure, the process described above by referring to the flowchart can be implemented as a computer software program. For example, an embodiment of the present disclosure provides a computer program product comprising a computer program loaded to a computer-readable medium, the computer program comprising program codes for executing the method shown in the flowchart. In such an embodiment, the computer program can be downloaded and installed from a network via the communication portion 709, and/or installed from the removable medium 711. When the computer program is executed by the central processing unit (CPU) 701, the above-mentioned functions defined in the system of the present disclosure are executed.

It should be noted that the computer-readable medium shown in the present disclosure may be a computer-readable signal medium or a computer-readable storage medium or a combination of the two. An example of the computer-readable storage medium can be, but is not limited to: electric, magnetic, optical, electromagnetic, infrared, or semiconductor systems, apparatuses, elements, or any combination thereof. A more specific example of the computer-readable storage medium can comprise, but is not limited to: an electrical connection with one or more wires, a portable computer disk, a hard disk, a random access memory (RAM), a read-only memory (ROM), an erasable programmable read-only memory (EPROM or flash memory), a fiber, a portable compact disk read-only memory (CD-ROM), an optical memory, a magnetic memory, or any suitable combination thereof. In the present disclosure, the computer-readable storage medium can be any tangible medium containing or storing programs which can be used by an instruction execution system, apparatus or device or incorporated thereto. In the present disclosure, the computer-readable signal medium can comprise data signals in a baseband or propagated as part of carriers, in which computer-readable program codes are carried. The propagated data signals can be in various forms, comprising but not limited to electromagnetic signals, optical signals or any suitable combination thereof. The computer-readable signal medium can also be any computer-readable medium beyond the computer-readable storage medium. The computer-readable medium is capable of sending, propagating or transmitting a program used by an instruction execution system, apparatus or device or a combination thereof. The program codes included in the computer-readable medium can be transmitted by any appropriate medium, comprising but not limited to wireless, wired, optical cable, RF, etc., or any appropriate combination thereof.

The flowcharts and block diagrams in the drawings illustrate system architectures, functions and operations that may be implemented according to the systems, methods and computer program products of various embodiments of the present disclosure. In this regard, each of the blocks in the flowcharts or block diagrams can represent a module, a program segment, or a code portion, the module, program segment, or code portion including one or more executable instructions for implementing specified logic functions. It should also be noted that, in some alternative implementations, the functions denoted by the blocks may occur in a sequence different from the sequences shown in the figures. For example, any two blocks presented in succession can be executed substantially in parallel, or sometimes in a reverse sequence, depending on the function involved. It should also be noted that each block in the block diagrams and/or flowcharts as well as a combination of blocks can be implemented using a dedicated hardware-based system executing specified functions or operations, or by a combination of a dedicated hardware and computer instructions.

The modules described in the embodiments of the present disclosure can be implemented by software or hardware. The described modules can also be arranged in a processor, for example, described as: a processor, comprising a data acquisition module, a data sending module, and a wafer repair module. The names of these modules do not constitute limitations on the modules themselves under certain circumstances. For example, the data acquisition module can also be described as "a module for downloading test data from a file server connected".

As another aspect, the present disclosure further provides a computer-readable medium. The computer-readable medium can be included in the device described in the above embodiment, or a stand-alone computer-readable medium not assembled into the device. The computer-readable medium carries one or more programs. When the one or more programs are executed by a device, the device comprises: a laser equipment acquiring test data for repairing a predetermined wafer; the laser equipment sending the test data to a processing server so that the processing server converts the test data into repair data in a predetermined format; and the laser equipment obtaining the repair data in the predetermined format to repair the predetermined wafer.

The exemplary embodiments of the present disclosure are specifically shown and described above. It should be understood that the present disclosure is not limited to the detailed structure, arrangement or implementation method described herein; on the contrary, the present disclosure is intended to cover various modifications and equivalent arrangements included in the spirit and scope of the appended claims.

The invention claimed is:

1. A wafer repair method, comprising:
   acquiring, by laser equipment, test data for repairing a predetermined wafer;
   sending, by the laser equipment, the test data to a processing server, so that the processing server converts the test data into repair data in a predetermined format; and
   obtaining, by the laser equipment, the repair data in the predetermined format to repair the predetermined wafer; wherein:
   the sending, by the laser equipment, the test data to a processing server so that the processing server converts the test data into repair data in a predetermined format comprises:
   remotely calling, by the laser equipment, a file conversion program in the processing server through a file conversion instruction, so that the processing server executes the file conversion program to obtain the test data; and
   remotely calling, by the laser equipment, the file conversion program through the file conversion instruction, so that the processing server executes the file conversion program to convert the test data into the repair data in the predetermined format; and
   the repair data is decimal laser fuse coordinates.

2. The method according to claim 1, wherein
   the obtaining, by the laser equipment, the repair data in the predetermined format to repair the predetermined wafer comprises:
   transmitting the repair data in the predetermined format to the laser equipment in a binary format, the repair data in the predetermined format being stored in the processing server; and
   repairing, by the laser equipment, the predetermined wafer according to the repair data in the predetermined format.

3. The method according to claim 1, further comprising:
   acquiring, by the laser equipment, identification information of the predetermined wafer; and
   downloading, by the laser equipment, the test data from a file server according to the identification information.

4. The method according to claim 1, further comprising:
   deleting the test data stored in the laser equipment.

5. The method according to claim 1, wherein
   a transmission speed of a memory of the processing server is higher than a transmission speed of a memory of the laser equipment.

6. The method according to claim 1, wherein
   a system environment of the laser equipment is different from a system environment of the processing server.

7. A wafer repair system, comprising
   laser equipment and a processing server, the laser equipment being connected to the processing server, wherein:
   the laser equipment is configured to acquire test data for repairing a predetermined wafer, send the test data to the processing server, obtain repair data in a predetermined format, and repair the predetermined wafer;
   the processing server is configured to acquire the test data, and convert the test data into the repair data in the predetermined format;
   the laser equipment is further configured to remotely call a file conversion program in the processing server through a file conversion instruction;
   the processing server is further configured to execute the file conversion program to obtain the test data, and convert the test data into the repair data in the predetermined format; and
   the repair data is decimal laser fuse coordinates.

8. The system according to claim 7, wherein
   a number of the laser equipment is plural, and the plurality of laser equipment is connected to the processing server via a local area network.

9. The system according to claim 7, wherein
   a transmission speed of a memory of the processing server is higher than a transmission speed of a memory of the laser equipment.

10. The system according to claim 7, wherein
    a system environment of the laser equipment is different from a system environment of the processing server.

11. The system according to claim 7, wherein the laser equipment comprises:
    a data acquisition module, configured to acquire the test data for repairing the predetermined wafer;
    a data sending module, configured to send the test data to the processing server so that the processing server converts the test data into repair data in the predetermined format; and
    a wafer repair module, configured to obtain the repair data in the predetermined format to repair the predetermined wafer.

12. The system according to claim 11, wherein the laser equipment further comprises:
    a data processing module, configured to remotely call the file conversion program in the processing server through the file conversion instruction so that the processing server executes the file conversion program to obtain the test data;
    wherein the data processing module is further configured to remotely call the file conversion program through the file conversion instruction so that the processing server executes the file conversion program to convert the test data into the repair data in the predetermined format.

13. The system according to claim 11, wherein the laser equipment further comprises:
    a data transmission module, configured to transmit the repair data in the predetermined format to the laser equipment in a binary format, the repair data in the predetermined format being stored in the processing server;
    wherein the wafer repair module is further configured to repair the predetermined wafer according to the repair data in the predetermined format.

14. The system according to claim 11, wherein
    the data acquisition module is further configured to acquire identification information of the predetermined wafer; and
    the data acquisition module is further configured to download the test data from a file server according to the identification information.

15. The system according to claim 11, wherein the laser equipment further comprises:
    a data deletion module, configured to delete the test data stored in the laser equipment.

16. A wafer repair device, comprising:
    a memory, a processor, and executable instructions stored in the memory and executable in the processor, wherein when the processor executes the executable instructions, the method according to claim 1 is implemented.

17. A non-transitory computer-readable storage medium, storing computer executable instructions thereon, wherein when the computer executable instructions are executed by a processor, the method according to claim 1 is implemented.

\* \* \* \* \*